US006787969B2

(12) United States Patent
Grade et al.

(10) Patent No.: US 6,787,969 B2
(45) Date of Patent: Sep. 7, 2004

(54) DAMPED MICROMECHANICAL DEVICE

(75) Inventors: John D. Grade, Mountain View, CA (US); John H. Jerman, Palo Alto, CA (US); Kevin Y. Yasumura, Danville, CA (US); Joseph D. Drake, Palo Alto, CA (US)

(73) Assignee: Iolon, Inc., San Jose, CA (US)

( * ) Notice: Subject to any disclaimer, the term of this patent is extended or adjusted under 35 U.S.C. 154(b) by 0 days.

(21) Appl. No.: 09/876,265

(22) Filed: Jun. 6, 2001

(65) Prior Publication Data

US 2002/0101129 A1 Aug. 1, 2002

Related U.S. Application Data

(60) Provisional application No. 60/209,558, filed on Jun. 6, 2000.

(51) Int. Cl.[7] ................................................. H02N 1/00
(52) U.S. Cl. ...................... 310/309; 359/223; 359/298; 73/504.12
(58) Field of Search ........................ 310/309; 359/223, 359/872, 877, 298; 73/504.12, 514.32

(56) References Cited

U.S. PATENT DOCUMENTS

| | | | | |
|---|---|---|---|---|
| 5,659,418 | A | 8/1997 | Yurke | 359/290 |
| 5,834,646 | A | 11/1998 | Kvisteroey et al. | 73/514.29 |
| 5,969,465 | A | * 10/1999 | Neukermans | 310/333 |
| 6,201,629 | B1 | 3/2001 | McClelland et al. | 359/223 |
| 6,236,005 | B1 | 5/2001 | Kvisteroey et al. | 200/61.45 R |
| 6,360,033 | B1 | * 3/2002 | Lee et al. | 385/18 |

FOREIGN PATENT DOCUMENTS

| | | | | |
|---|---|---|---|---|
| JP | 4-368479 | * 12/1992 | ............ | H02N/1/00 |
| WO | WO 92/20096 | 11/1992 | ............ | H01L/23/02 |

OTHER PUBLICATIONS

Translation of Suzuki et al. (Dec. 1992).*
Lynn Roylance, "A Batch–Fabricated Silicon Accelerometer", IEEE Trans. Elec. Dev., vol. ED–26, Dec. 1979, pp. 1911–1917.
T. Veijola, et. al., "Circuit Simulation Model of Gas Damping in Microstructures with Nontrivial Geometries", Proceedings of the 9th Int. Conference on Solid–State Sensors and Actuators, Stockholm, Jun. 1995, pp. 36–39.
J. Yang, et. al., "Dominated Energy Dissipation in Ultrathin Single Crystal Silicon Cantilever: Surface Loss", 13th Annual International Conference on Micro Electro Mechanical Systems (MEMS 2000), Miyazaki, Jan., 2000, pp. 235–240.
H. Hosaka, et. al., "Evaluation of Energy Dissipation Mechanisms in Vibrational Microstructures",, 1994 Proceedings IEEE Micro Electro Mechanical Systems Workshop, Feb. 1994, pp. 193–195.
Y.–H. Cho, et. al. "Viscous Energy Dissipation in Laterally Oscillating Planar Microstructures: A Theoretical and Experimental Study", 1993 Proceedings IEEE Micro Electro Mechanical Systems Workshop, Feb., 1993, pp. 93–98.

* cited by examiner

Primary Examiner—Karl Tamai
(74) Attorney, Agent, or Firm—Dorsey & Whitney LLP

(57) ABSTRACT

A damped micromechanical device comprising a substrate, a movable structure overlying the substrate and a flexural member having a first end portion coupled to the substrate and a second end portion coupled to the movable structure. The movable structure is movable at a resonant frequency between first and second positions relative to the substrate. A damping material is adhered to at least a portion of the flexural member for damping the movement of the movable structure at the resonant frequency. A method for making the micromechanical device is provided.

35 Claims, 5 Drawing Sheets

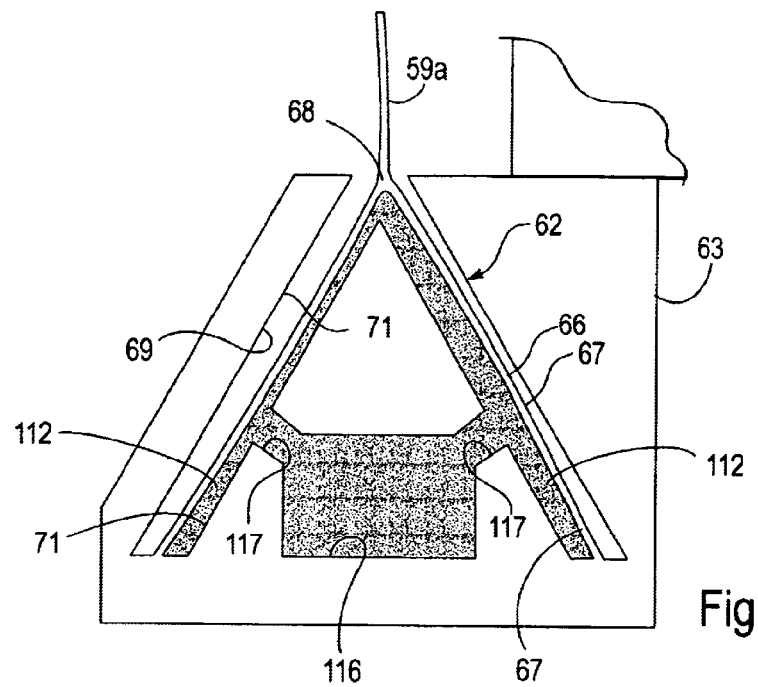
Fig. 5
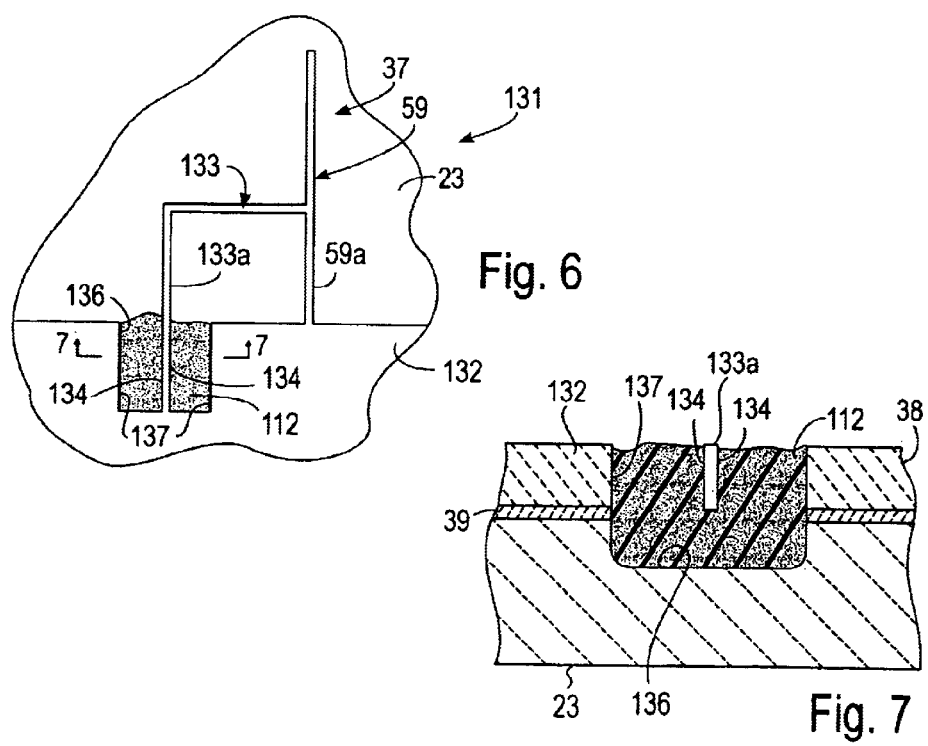
Fig. 6
Fig. 7

DAMPED MICROMECHANICAL DEVICE

CROSS-REFERENCE TO RELATED APPLICATION

The application claims priority to U.S. provisional patent application Serial No. 60/209,558 filed Jun. 6, 2000, the entire content of which is incorporated herein by this reference.

SCOPE OF THE INVENTION

The present invention relates generally to micromechanical devices and more particularly to damped micromechanical devices.

BACKGROUND

Micromechanical devices have heretofore been provided, and include sensors such as accelerometers, angular rate sensors and gyroscopes and optical devices such as optical switches, scanners, interferometers and tunable filters. Each of such devices includes a moving structure supported by flexural elements and is thus a spring mass system having one or more mechanical resonant modes. These modal frequencies are typically estimated through the use of finite element analysis. A mechanical quality factor or Q, which is a measure of the damping associated with the motion of the part, can be associated with each of these resonant modes.

For micromechanical devices fabricated in materials such as silicon, silicon dioxide, silicon nitride, or metals such as aluminum or nickel, the inherent damping of the structural material itself is extremely low. For example, electrostatic microactuators manufactured using deep reactive ion etched (DRIE) techniques often have comb gaps on the order of ten microns and thus do not provide damping in air that is sufficient for using such microactuators as positionable actuators. As a result, such devices typically have measurements of the mechanical quality factor Q in a vacuum that are typically greater than 5,000 and are potentially susceptible to external vibration or shock, especially from disturbances closely matching the frequency of one of the mechanical resonant modes of the device. It is thus important to control the damping of micromechanical devices.

Although viscous damping of micromechanical devices occurs from the dissipation of energy resulting from the motion of fluid, such as air or liquid, in which the device resides, attempts to control the damping of such devices have been limited. For devices which operate at or near a mechanical resonance, such as some vibrational gyroscopes, it has been desirable to maximize the mechanical quality factor Q of the system by devising methods to package the devices in vacuum, thereby reducing the viscous damping due to air. Papers describing the effects of primarily air damping on a variety of micromechanical devices include: "Viscous Energy Dissipation in Laterally Oscillating Planar Microstructures: A Theoretical and Experimental Study", by Y.-H. Cho, et. al., 1993 Proceedings IEEE Micro Electro Mechanical Systems Workshop, Feb, 1993, pp. 93–98, and "Evaluation of Energy Dissipation Mechanisms in Vibrational Microstructures", by H. Hosaka, et. al., 1994 Proceedings IEEE Micro Electro Mechanical Systems Workshop, February 1994, pp. 193–195. Neither of these papers, however, contains recommendations for modifying the geometry or structure to optimize the damping of a device.

Some micromechanical devices, such as sensors, have relatively limited mechanical motion and can thus be controlled by including structures with small gaps, typically on the micron scale, in the device. In this technique, called squeeze-film damping, motion of the part causes such a gap to open and close, resulting in a fluid such as air flowing in and out of the gap. One of the many papers describing the use of holes through a structure to modify the squeeze-film effect is "Circuit Simulation Model of Gas Damping in Microstructures with Nontrivial Geometries", by T. Veijola, et. al., Proceedings of the $9^{th}$ Int. Conference on Solid-State Sensors and Actuators, Stockholm, June, 1995, pp. 36–39. Unfortunately, squeeze-film damping is not generally suitable for devices having greater than a few microns of motion.

A limited amount of work has been done with linear accelerometers by packaging them in a viscous liquid, such as a silicone oil, to minimize "ringing" caused by the response of the accelerometer to shock. The practical issues involved with using fluids other than air to control or adjust damping in micromechanical devices have been discussed. See, for example, "A Batch-Fabricated Silicon Accelerometer", by Lynn Roylance, IEEE Trans. Elec. Dev., Vol. ED-26, December, 1979, pp1911–1917. See also International Application No. PCT/N092/00085 having International Publication No. WO 92/20096 by T. Kvisteroy et al. entitled "Arrangement for Encasing a Functional Device, and a Process for the Production of the Same". Neither of these publications, however, discuss the damping of actuators.

The energy loss and thus the mechanical quality factor Q of micromachined cantilever beams and other mechanical resonators have heretofore been studied. See, for example, "Dominated Energy Dissipation in Ultrathin Single Crystal Silicon Cantilever: Surface Loss", by J. Yang, et. al., $13^{th}$ Annual International Conference on Micro Electro Mechanical Systems (MEMS 2000), Miyazaki, January 2000, pp. 235–240, which discusses the influence of various atomic layers such as silicon dioxide and absorbates on the surface of the cantilevers on the mechanical quality factor Q of the cantilevers. See also U.S. Pat. No. 5,659,418 entitled "Structure for Membrane Damping in a Micromechanical Modulator", which discloses controlling the damping of a device with mechanical transmission lines that couple the vibration from the modulator structure to the damping region of the device. Unfortunately, neither of these publications discuss controlling or modifying the mechanical quality factor Q of an actuator device.

As can be seen, none of the foregoing techniques has been used with actuators, and specifically with electrostatic actuators.

In general, it is an object of the present invention to provide a micromechanical device which is damped so as to control the resonant mode of the microactuator contained therein.

Another object of the invention is to provide a microactuator of the above character in which a material is adhered to a flexural member of the microactuator to damp the microactuator at such resonant mode.

Another object of the invention is to provide a microactuator of the above character in which the material is an elastomeric material.

Another object of the invention is to provide a microactuator of the above character in which the material is adhered to the flexural member after the manufacture of the microactuator.

Another object of the invention is to provide a microactuator of the above character in which the material is adhered to the flexural member during the manufacture of the microactuator.

Another object of the invention is to provide a micromechanical device of the above character in which the material is introduced into an etched recess during the manufacture of the flexural member.

SUMMARY OF THE INVENTION

The present invention provides a damped micromechanical device comprising a substrate, a movable structure overlying the substrate and a flexural member having a first end portion coupled to the substrate and a second end portion coupled to the movable structure. The movable structure is movable at a resonant frequency between first and second positions relative to the substrate. A damping material is adhered to at least a portion of the flexural member for damping the movement of the movable structure at the resonant frequency. A method for making the micromechanical device is provided.

BRIEF DESCRIPTION OF THE DRAWINGS

The accompanying drawings, which are somewhat schematic in many instances and are incorporated in and form a part of this specification, illustrate several embodiments of the invention and, together with the description, serve to explain the principles of the invention.

FIG. 5 is an enlarged view, similar to FIG. 2, of a portion of the micromechanical device of FIG. 1 in a second position.

FIG. 6 is an enlarged view of a portion of another damped micromechanical device of the present invention.

FIG. 7 is a cross-sectional view of the micromechanical device of FIG. 6 taken along the line 7—7 of FIG. 6.

DESCRIPTION OF THE INVENTION

Figure 1:
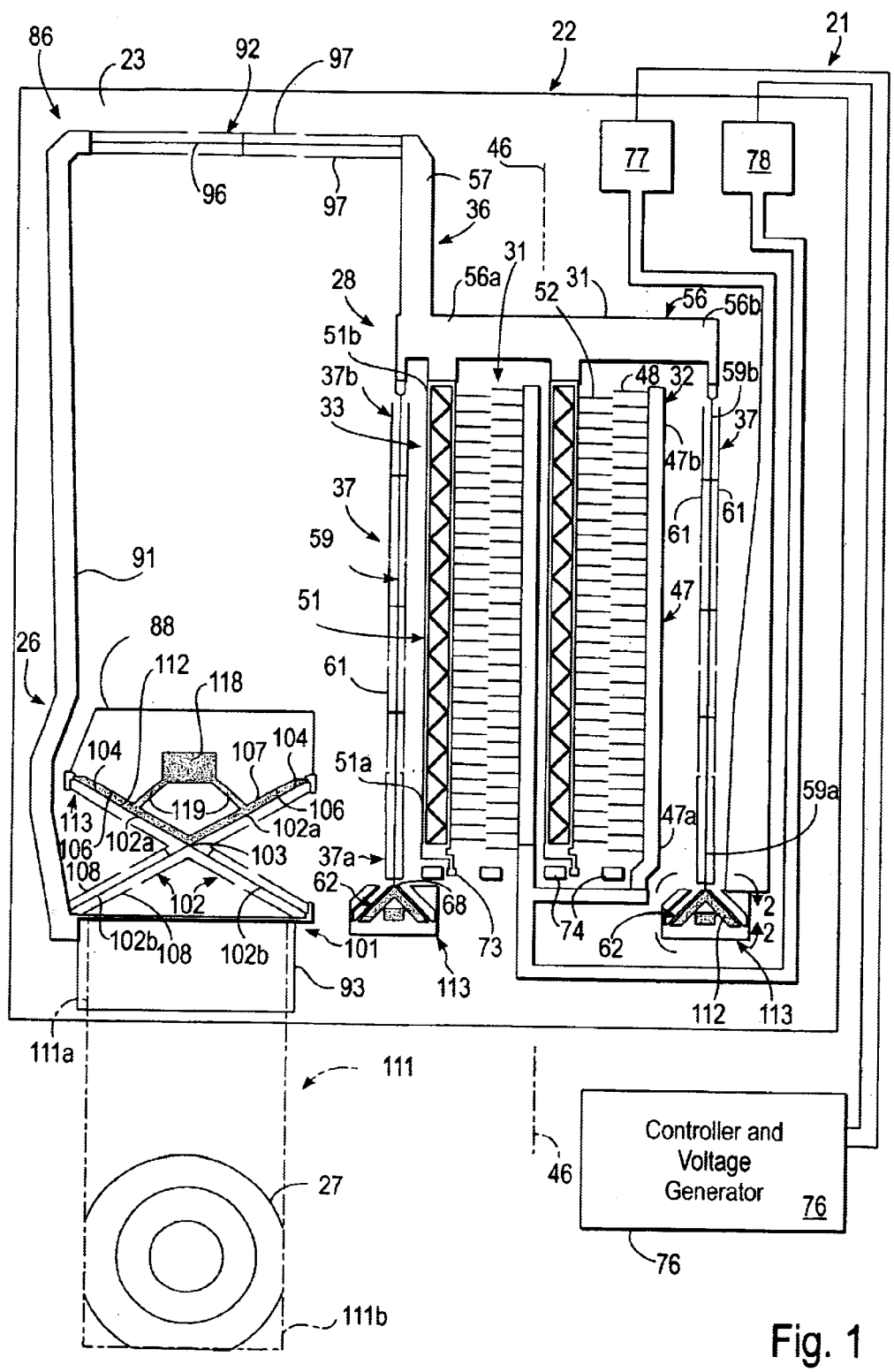
FIG. 1 is a top plan view of a damped micromechanical device of the present invention.
Figure 2:
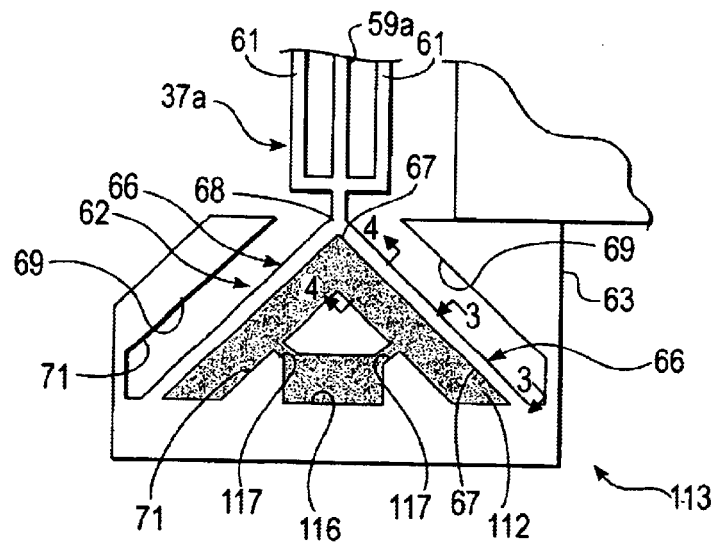
FIG. 2 is an enlarged view of a portion of the micromechanical device of FIG. 1 taken along the line 2—2 of FIG. 1.

The micromechanical device of the present invention can be in the form of a lens adjuster 21, shown in FIG. 1, suitable for use in a tunable laser of the type disclosed in U.S. patent application Ser. No. 09/728,212 filed Nov. 29, 2000 (Our file number A-70056), the entire content of which is incorporated herein by this reference. In general, lens adjuster 21 includes a microactuator 22 formed on a substrate 23 and coupled to a lever assembly 26. A collimating lens 27 is carried by the lever assembly 26.

Microactuator 22 can be of any suitable type, such as an electromagnetic microactuator or any other electrically-driven microactuator, but is preferably an electrostatic microactuator. The microactuator 22 has similarities to the microactuators disclosed in U.S. Pat. No. 6,384,510 and U.S. Pat. No. 6,469,415, the entire content of each of which is incorporated herein by this reference. In this regard, microactuator 22 is formed on planar substrate 23 and has a movable structure 28 that overlies substrate 23. At least one and as shown first and second comb drive assemblies 31 are carried by substrate 23 for moving structure 23 in a direction relative to the substrate. Each of the first and second comb drive assemblies 31 includes a first drive member or comb drive member 32 mounted on substrate 23 and a second drive member or comb drive member 33 overlying the substrate. The second comb drives are joined to each other by a shuttle 36. Movable structure 28 includes second comb drives 33 and shuttle 36 and is supported or suspended above substrate 23 by first and second spaced-apart springs 37.

Figure 3:
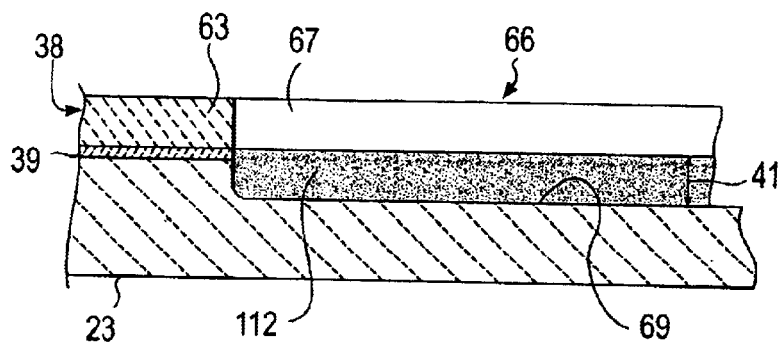
FIG. 3 is a cross-sectional view of the micromechanical device of FIG. 1 taken along the line 3—3 of FIG. 2.
Figure 4:
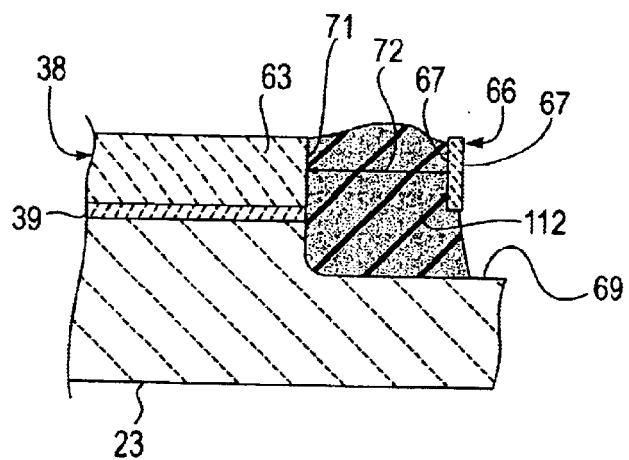
FIG. 4 is a cross-sectional view of the micromechanical device of FIG. 1 taken along the line 4—4 of FIG. 2.

Substrate 23 is made from any suitable material such as silicon and is preferably formed from a silicon wafer. The substrate has a thickness ranging from 200 to 600 microns and preferably approximately 400 microns. Movable structure 28 and first and second springs 37 are formed atop substrate 23 by a second or top layer 38 made from a wafer from any suitable material such as silicon (see FIGS. 3 and 4). Top wafer 38 has a thickness ranging from 10 to 200 microns and preferably approximately 85 microns and is secured to substrate 23 by any suitable means. The top wafer 38 is preferably fusion bonded to the substrate by means of a silicon dioxide layer 39, which further serves as an insulator between the conductive top wafer 38 and the conductive substrate 23. Top wafer 38 may be lapped and polished to the desired thickness. Movable structure 28 and first and second springs 37 are formed from top wafer 38 by any suitable means, and are preferably etched from the wafer 38 using deep reactive ion etching techniques. The movable structure 28 and springs 37 are spaced above substrate by an air gap 41, shown in FIG. 3, that ranges from one to 30 microns so as to be electrically isolated from the substrate 23.

First and second comb drive assemblies 31 and 32 extend parallel to each other and to longitudinal axis 46 of linear microactuator 22. Each of first and second comb drive assemblies 31 has a length ranging from 200 to 2000 microns and preferably approximately 800 microns. Stationary comb drive 32 of each of first and second comb drive assemblies 31 is immovably secured to substrate 23 and has a longitudinally-extending truss or bar 47 having first and second end portions 47a and 47b. A plurality of comb drive fingers or comb fingers 48 extend from one side of bar 47 in longitudinally spaced-apart positions along the length of the bar. Second or movable comb drive 33 of each of first and second comb drive assemblies 32 and 33 is spaced above substrate 23 so as to be movable relative to the substrate and stationary comb drives 32. The movable comb drives 33 have a construction similar to the stationary comb drives 32 and, more specifically, are each formed with a longitudinally-extending truss or bar 51 having first and second end portions 51a and 51b. A plurality of comb drive fingers or comb fingers 52 extend from one side of bar 51 in longitudinally spaced-apart positions along the length of the bar. Second or movable comb fingers 52 face first or stationary comb fingers 48. Stationary and movable comb fingers 48 and 52 are shown as being similar in construction and each have a length ranging from 15 to 150 microns and preferably approximately 60 microns.

The second end portions 51b of each of the movable bars 51 is rigidly joined to shuttle 33, which has a main portion 56 provided with first and second end portions 56a and 56b and an arm 57 extending at a right angle to the main portion at first end portion 56a. The movable bars 51 extend perpendicularly from the main portion 46 at longitudinally spaced-apart positions along the length of the main portion.

Means including first and second spaced-apart flexural members or springs 37 are included within microactuator 22 for movably supporting structure 28 over substrate 20 and providing linear stiffness to the movable comb drives 33 and movable structure 28. Each of springs 37 has a first end portion coupled to substrate 23 and a second end portion coupled to an end portion 56a or 56b of shuttle 33. Springs 37 are disposed on opposite sides of longitudinal axis 46 and extend parallel to axis 46 when in their rest position shown in FIG. 1. First and second comb drive assemblies 31 are disposed between springs 37, although at least some of the comb drive assemblies 31 can optionally be disposed outside of the springs 37 and be within the scope of the present invention. First and second springs 37 each have a length approximating the length of first and second comb drive assemblies 31.

Each of springs 37 can be of any suitable type and is preferably formed from a single beam-like member 59 having first and second opposite end portions 59a and 59b. Second end portion 59b of each spring member is joined to shuttle main portion 56. First end portion 37a of each spring includes a hinge 62 that is secured to an anchor 63 mounted on substrate 23 (see FIGS. 1–5). Each of the hinges 62 is triangular in shape with a portion of anchor 63 serving as the base of the triangular hinge 62. First and second legs 66 can have any suitable length, for example approximately 100 microns, and extend outwardly and toward each other from anchor 63 to form the remaining two sides of the triangular hinge 62. Legs 66 have first and second opposite side surfaces 67 and join each other at an angle of 90 degrees or less and preferably approximately 60 degrees at a vertex 68. First end portion 59a of the spring member 59 is joined to the hinge at vertex or pivot point 68. Anchor 63 has first and second channels 69 for receiving respective first and second legs 66. Each of channels 69 is formed in part by first and second opposing wall surfaces 71. The spacing or gap 72 between each side surface 67 of each leg 66 and the opposing wall surface 71 ranges from three to 30 microns and is preferably approximately ten microns. In this regard, FIGS. 2–5 are not drawn to scale relative to FIG. 1; certain spaces and dimensions in FIGS. 2–5 have been exaggerated for simplicity.

Second or movable comb drives are movable in a first direction relative to the first comb drives 32 from their first position shown in FIG. 1, in which comb fingers 48 and 52 are not substantially fully interdigitated, to a second position (not shown) in which the comb fingers 48 and 52 are substantially fully interdigitated. Movable comb fingers 52 are shown in FIG. 1 as being fully disengaged, and thus not partially interdigitated, when in their first position. Nonetheless, it should be appreciated that the movable comb fingers can be partially interdigitated with the stationary comb fingers 48 when in their first position and be within the scope of the present position. When in their second position, movable comb fingers 52 extend between respective stationary comb fingers 48. The movable comb fingers 52 approach but preferably do not engage stationary bar 47 and, similarly, stationary comb fingers 48 approach but preferably do not engage movable bar 51 as the movable comb drives 33 move to their second position. First and second springs 37 permit the movement of second comb drives 33, and thus shuttle 33 and the remainder of movable structure 28, and provide longitudinal rigidity to movable structure 28 and shuttle 33 so as to inhibit snap over between interdigitated comb fingers 48 and 52. Shuttle 33 moves substantially perpendicular to longitudinal axis 46 as it moves between its first and second positions. A bumper 73 is provided on the first end portion 51a of each of movable bars 51 for engaging respect stops 74 formed on substrate 23 to limit the sideways movement of shuttle 33 and the remainder of movable structure 28 and thus define the first and second positions of the shuttle and movable structure.

Stationary and movable comb fingers 48 and 52 are preferably of the type disclosed in U.S. patent application Ser. No. 09/547,698 filed Apr. 12, 2000 and, as such, are inclined and offset. In general, each of the comb fingers is slightly inclined from a line extending normal to the respective bar 47 or 51. In addition, when movable comb drives 33 are in their first or rest position, each of movable comb fingers 52 is offset relative to a midpoint line extending between the adjacent pair of stationary comb fingers 48 into which such movable comb finger 52 interdigitates. When the movable comb drives 33 move to their second position, in which the movable comb fingers 52 interdigitate with the stationary comb fingers 48, each movable comb finger 52 becomes centered on such midpoint line. The inclination and offset of stationary and movable comb fingers 48 and 52 accommodate the foreshortening and deflection of springs 37 and the resulting longitudinal movement of movable comb drives 33 as movable structure 28 moves from its first position, in which springs 37 are in a straightened position as shown in FIG. 1, to its second position, in which springs 37 are bent or deflected.

Electrical means is included for driving movable comb drives 33 between their first and second positions. Such electrical means can include a controller and voltage generator 76 electrically connected to a plurality of electrodes provided on substrate 23. Such electrodes include a ground or common electrode 76 electrically coupled to anchor 63 and thus movable comb drives 33 and one or more drive electrodes 78 coupled to stationary comb drives 32. A metal layer (not shown) made from aluminum or any other suitable material is provided on the top surface of top wafer 38 for creating the electrodes and any leads relating thereto. Controller and voltage generator 76, typically not an integral part of lens adjuster 21, is electrically coupled by leads for other means to electrodes 77 and 78 and is shown schematically in FIG. 1.

Means in the form of a closed loop servo control can be included for monitoring the position of movable comb drives 33 and thus movable structure 28. For example, controller 76 can determine the position of movable comb drives 33 by means of a conventional algorithm included in the controller for measuring the capacitance between comb fingers 48 and 52. A signal separate from the drive signal to the comb drives 32 and 33 can be transmitted by controller 76 to microactuator 22 for measuring such capacitance. Such a method does not require physical contact between comb drive fingers 48 and 52. Alternatively, were microactuator 22 is used in an optical system, as in the instance application, all or a portion of the output optical energy from lens adjuster 21 can be measured and the drive signals from the controller 76 to the microactuator 22 appropriately adjusted.

A counterbalance or counterbalancing means 86 is carried by substrate 23 and coupled to movable comb drives 33 of lens adjuster 21 for counterbalancing the adjuster in the manner disclosed in U.S. Pat. No. 6,469,415 (see FIG. 1). The counterbalance 86 includes lever assembly or coupler 26 formed from top wafer 38 and disposed atop substrate 23. An anchor or mount 88 is rigidly secured to the substrate 23. A rigid lever arm 91 has a first end portion coupled to shuttle 33 by means of a spring 92 and a second end portion in the form of a platform 93. Flexural member or spring 92 is substantially similar to first and second springs 37 and has an elongate beam-like spring member 96 joined to lever arm 91 and shuttle arm 57 at its respective ends. Spring 92 further includes first and second sacrificial bars 97, similar to sacrificial bars 61 disclosed above, which extend parallel to spring member 97 along each of the opposite sides of the spring member.

Lever arm 91 is secured to anchor 88 by a pivot assembly or hinge 101 which is X-shaped when view in plan, as shown in FIG. 1. Pivot assembly 101 has first and second pivot arms 102 joined at their center to form a pivot point 103. Each of the pivot arms has a first end portion 102a rigidly joined to anchor 88 and a second end portion 102b rigidly joined to platform 93. The first end portion 102a of each of the pivot arms has a side surface 104 spaced apart from and parallel to a wall surface 106 of anchor 88 to form a channel 107 along the first end portion of the pivot arm. Such channels 107 have a width ranging from three to 30 microns and preferably approximately ten microns and meet at pivot point 103. Sacrificial bars 108, similar to sacrificial bars 61 disclosed above, extend parallel to the opposite side surface 104 of each first end portion 102a and along both side surfaces of second end portions 102b of the pivot arms.

Collimating lens 27 is carried by platform 93 of lever assembly 26. In this regard, a lens substrate or block 111 is provided and has a first end portion 111a adhered to platform 93 by any suitable means such as an adhesive and a second end portion 111b in which collimating lens 27 is formed.

A damping material 112 is included within lens adjuster 21 for damping the movement of movable structure 28 and collimating lens 27 at the resonant frequency of microactuator 22. Damping material 112 is preferably adhered to at least a portion of one or more of the flexural or spring members of lens adjuster 21 so as to dampen the movement of such flexural or spring member and movable components carried thereby. In lens adjuster 21, damping material 112 is adhered to at least a portion of springs 37 for damping the movement of movable structure 28 and at least a portion of the pivot arms 102 of pivot assembly 101 for damping the movement of lever assembly 26.

More specifically, the damping material 112 is adhered to the side surfaces 67 of the legs 66 that face towards each other. The damping material optionally adheres to the opposing wall surface 71 of anchor 63 so as to fill the portion of channel 69 between each such side surface and such wall surface and be disposed between the flexural hinge 62 and anchor 63 (see FIG. 4). As noted above, FIGS. 2–5 are not drawn to scale relative to FIG. 1. In one preferred embodiment, spacing 72 between surfaces 67 and 71 is approximately ten microns, the height of each leg 66 is 85 microns and the air gap 41 between the base of leg 66 and the top surface of substrate 23 ranges from five to ten microns. With such dimensions, it should be appreciated from FIG. 4 that damping material 112 remains in the space between leg 66 and anchor 63 before curing and does not flow beneath the leg 66. In pivot assembly 101, damping material 112 is similarly adhered to the side surfaces 104 of the first end portions 102a of the pivot arms 102, and optionally adheres to the opposing wall surface 106 of anchor 88 so as to fill channels 107 and be disposed between the flexural arms 102 and anchor 88.

To facilitate application of the damping material to legs 66, each of anchors 63 is formed with a central cavity or reservoir 116 which opens on to each of channels 69 by means of respective passageways 117. After the manufacture of microactuator 22 from top wafer 38, the damping material 112 is introduced into reservoir 116 so as to travel through passageways 117 by capillary action and into channels 69 (see FIG. 4). Each of hinges 62 and damping material 112 adhered thereto serve as a damping region 113 for microactuator 22 and lens adjuster 21. Anchor 88 of lever assembly 77 is similarly provided with a cavity or reservoir 118 having openings or passageways 119 communicating with first and second channels 107. The damping material 112 is supplied to reservoir 118 so as to travel through passageways 119 by capillary action into channels 107. Pivot arms 102 and damping material 112 adhered thereto serve as an additional damping region 113 for lens adjuster 21.

Although any suitable damping material can be utilized, the desired material properties of damping material 112 depend upon the quantity and placement of the damping material in microactuator 22 and lens adjuster 21. The damping material preferably has a modulus of elasticity less than a modulus of elasticity of the flexural member or members of lens adjuster 21 onto which the damping material is adhered. In one preferred embodiment, damping material 112 is an elastomeric material. In the embodiments of lens adjuster 21 where the flexural members thereof are made from top wafer 38, and thus silicon, relatively low modulus polymers can be utilized. Since silicon has a modulus of elasticity of about 190 GPa, such polymers should each have a modulus of elasticity substantially below that value.

The modulus of elasticity of polymer materials can be modeled as having both a real-valued and an a imaginary component such that a complex modulus of elasticity, or Young's modulus, can be written as $E=E_1+iE_2$. With this definition, the mechanical quality factor Q of such a material is given by $Q=E_1/E_2$. Particularly preferred polymer materials include epoxies, urethanes, acrylates, polyimides and silicones, with reported or estimated real moduli from 241 MPa to 2.7 KPa.

In order to determine how effective each of the foregoing polymer materials is as a damping materia, a beam resonator technique was used to measured the imaginary modulus of the materials. In such technique, small stainless steel beams had small silicon pieces epoxied to their ends to serve as reflectors for a laser beam used to measure the beam resonator motion. A PSD was used to record the steel beam's oscillation and a digital scope was used to record the motion. Each of the beam oscillators was then mounted into a measurement setup where both the resonance frequency, $f_0$, and the mechanical quality factor Q could be measured. One of the foregoing damping materials was then applied to one side of the beam resonator. After curing of the damping material, the resonance frequency and mechanical quality factor Q were measured again. The mechanical quality factor was measured using a ring-down measurement technique. The digital scope recorded the ring-down motion and an exponential curve fit was used to determine the oscillator's decay time constant τ. The time constant, with the oscillator's resonance frequency, gives the quality factor $Q=p\tau f_0$.

The mechanical quality factor Q of the beam resonator before addition of the layer of damping material is limited by a variety of loss mechanisms including air damping and clamping loss. All of these loss mechanisms are considered when the initial total dissipation is expressed as $1/Q_{before}$. After the addition of the layer of damping material 112, an additional damping term representing such layer is added. For the case of a simple beam oscillator with a layer of damping material covering one side of the beam, the damping due to the presence of the layer can be approximated as $$\frac{1}{Q_{layer}} = \frac{3\delta \, E_{2,L}}{tE_1}$$

where $\delta$ is the thickness of the damping layer, $E_{2,L}$ is the loss modulus of the damping layer, t is the thickness of the original beam oscillator, and $E_1$ is the real modulus of the beam oscillator material. This equation is valid for a simple beam oscillator with a thickness much smaller than the beam width and length (t<w,t<l). It also assumes that all of the energy of the beam-layer system is stored in the beam while all of the damping comes from the damping layer. This places some restrictions on the modulus of the damping layer, as well as limitations on the beam-to-layer thickness ratio. For the materials studied, the $E_{1,L}$ values of the damping layer were at least an order of magnitude smaller than that of the steel beam. For materials such as Thermoset SC-300M, sold by Lord Chemical Products of Indianapolis, Ind., the bulk modulus was five orders of magnitude smaller than steel. With this equation for the additional surface loss term, the new total dissipation can be written as $$\frac{1}{Q_{after}} = \frac{1}{Q_{before}} + \frac{1}{Q_{layer}} = \frac{1}{Q_{before}} + \frac{3\delta \, E_{2,L}}{tE_1}$$

Solving for the damping layer loss modulus and making the estimate $\delta \sim 2t$ gives $$E_{2,L} = \frac{E_1}{6} \left( \frac{Q_{before} - Q_{after}}{Q_{before} Q_{after}} \right).$$

By measuring the mechanical quality factor Q before and after application of the layer of damping material 112, a means to obtain estimates of the damping layer loss modulus is obtained. The table below lists the estimated loss moduli for additional materials suitable for damping material 112 and studied in this manner. For $E_1$, the bulk value of stainless steel, 200 GPa, is used.

| Material | Real Modulus E1,L (MPa) | Loss Modulus E2,L (MPa) |
|---|---|---|
| Dymax OP-29 | 241 | 481 |
| Dymax OP-61 | 16550 | 276 |
| Semicosil 936UV | 0.73 | 8 |
| Epotek 310 | 5.65 | 74 |
| Dymax 60A | 6890 | 627 |
| Epoxies, Etc. 20-2350 | 2.63 | 68 |
| Thermoset SC-300M | 2.75E-3 | 1137 |
| Thermoset UR-312 | (Shore OO 50) | 379 |
| Transene RTV111 | 1.58 | 423 |
| Transene RTV141 | 1.58 | 267 |

Dymax OP-29, Dymax OP-61 and Dymax 60A are sold by Dymax Corporation of Torrington, Conn.; Semicosil 936UV is sold by Wacher Silicones Corporation of Adrian, Mich.; Epotek 310 is sold by Epoxy Technology of Billerica, Md.; Epoxies, Etc. 20-2350 is sold by Epoxies, Etc. of Greenville, R.I.; Thermoset UR-312 is sold by Lord Chemical Products of Indianapolis, Ind. and Transene RTV111 and Transene RTV141 are sold by Transene Company, Inc. of Danvers, Mass. It can be seen from the table that some materials potentially provide more damping than others. In general, materials such as Thermoset SC-300M with a high ratio of $E_2/E_1$ are desirable. Although the foregoing results are approximates, since several assumptions were made in generating the numbers in the table, the general trends are valid and provide estimates for use in modeling applications.

It is preferable that damping material 112 be selected and placed on the micromechanical device such that the mechanical quality factor of the device, as so damped by material 112, ranges from 0.3 to 20 and preferably ranges from 0.5 to 3.

In operation and use, lens adjuster 21 can be used in a tunable laser the manner described in U.S. patent applications Ser. No. 09/728,212 filed Nov. 29, 2000 to adjust the position of collimating lens 27 in the tunable laser. Suitable voltage potentials to drive electrode 78 can range from 20 to 200 volts and preferably range from 70 to 140 volts. Movable comb drives 33, and thus shuttle 33, of microactuator 22 are capable of 50 microns of linear travel when such drive voltages are utilized. Shuttle 36, and thus collimating lens 27, can be stopped and held at any location in such range of motion.

The inclusion of damping material 112 in lens adjuster 21 serves to desirably damp the motions of collimating lens 27 at the resonant frequency or frequencies of the lens adjuster. Damping material 112 is advantageously placed on the movable portion of lens -adjuster 21, and particularly on a flexural portion of the adjuster 21, to cause such damping. In this regard, damping material 112 is disposed in locations on lens adjuster 21 that induce strain in the damping material 112. When such strains are induced or relaxed in the damping material, energy is dissipated and damping of lens adjuster 21 is achieved. Strains are generated in flexural members used to support moving parts. Such flexural members of lens adjuster 21 include first and second springs 37 and pivot assembly 101. Maximum strains are typically produced near the proximal and distal ends of such flexural members. With respect to springs 37, such maximum strains are produced at first end portions 37a where the springs 37 are coupled to substrate 23 and at second end portions 37b where the springs are coupled to shuttle 33.

Damping material 112 of lens adjuster 21 is preferably disposed at one or more of such end portions of springs 37 and, in the disclosed embodiment of FIG. 1, is adhered to the first end portion 37a of each of the springs 37. As disclosed above, a hinge 62 is provided at each first end portion 37a and damping material 112 is adhered to legs 66 of each such hinge.

Damping material 112 is advantageously adhered to one or more of the outside or side surfaces of a flexural member since the largest strains are generated on such side surfaces. In this regard, damping material 112 is adhered to one or both of the side surfaces of legs 66 and, as shown, is specifically adhered to the inner side surface 67 of each of legs 66 in the triangular hinge 62. Similarly, damping material 112 is adhered to side surfaces 104 of pivot assembly 101. Such side surfaces 67 and 104 extend substantially perpendicular to substrate 23 and the in-plane motion of movable structure 28 and thus experience the largest strains at such locations on springs 37 and pivot assembly 101 during operation of microactuator 22 and lens adjuster 21.

Lens adjuster 21 has been advantageously provided with damping regions 113 which are separate and apart from the main flexural elements of the device. For example, the damping region 113 that includes first and second hinges 62 permits the main portion of the flexural elements or members of microactuator 22, that is spring members 59, to be separated from the flexural elements or members utilized for damping the microactuator and the adjuster, that is hinges 62. As shown in FIGS. 1 and 5, each of hinges 62 is provided with a pivot point at vertex 68 at which spring members 59 can pivot when moving from its straightened position, shown in FIG. 1, to its deflected position. Such pivoting of spring members 59 about pivot point 68 is unencumbered by damping material 112 adhered to the first end portion of the springs 37 of microactuator 22. As a result, such damping region 113 of microactuator 22 improves the ability to control the stiffness of first and second springs 37.

The damping regions 113 of lens adjuster 21 also permit compression or shear stress to a volume of damping material 112 during motion of movable structure 28. Such strain of damping material 112 in hinge 62 is shown in FIG. 5, where an exaggerated view of the hinge 62 is shown when movable comb drives 33 and thus shuttle 33 are in their second position and springs 37 in a deflected position. Damping material 112 within one channel 69 has been compressed and the damping material within the other channel has been expanded, in each case resulting in strain in the damping material 112 and thus energy dissipation.

It should be appreciated from the foregoing that damping material 112 can be selectively provided to surfaces and locations on a micromechanical device that generate strain during particular motions of the device, for example higher-order or out-of-plane resonances of the device, to dampen the device and thus tailor the frequency response of the device for a particular application.

Although damping material 112 has been shown as being used with a microactuator having comb drive assemblies for driving a movable structure in only a first direction, it should be appreciated that damping material 112 can be utilized with microactuators having one or more first comb drive assemblies for driving the movable structure in a first direction and one or more second comb drive assemblies for driving the movable structure in a second direction. Both linear and rotary electrostatic microactuator can be so damped. Any other type of electrostatic actuator can also be so damped.

Other embodiments of the damped micromechanical device of the present invention can be provided. In general, any micromechanical device having a movable part that experiences strain during such motion can be damped by adhering a damping material to all or any portion of such movable part. The damping material can be adhered to any or all of the sides of such part. Although damping material 112 is disclosed for use with microactuators or motors, it should be appreciated that accelerometers, sensors, gyroscopes, interferometers and other similar devices can be similarly damped. In addition to the electrostatic motors disclosed herein, damping material 112 can be used with any other electromagnetic actuators or any other type of electrically-driven microactuator such as a voice-coil motor. Portions of other electrostatic micromotors damped as disclosed herein are shown in FIGS. 6–11, none of which is drawn to scale.

In one such other embodiment, a portion of a microactuator 131 damped by means of damping material 112 is shown in FIGS. 6 and 7. Electrostatic microactuator 131 is substantially similar to microactuator 22 and like reference numerals have been used to describe like components of microactuators 22 and 131. The microactuator 131 includes first and second springs 37 for supporting a movable structure 28 over substrate 23. Spring member 59 of each spring 37 is coupled to substrate 23 by means of an anchor 132 formed from top wafer 38 and rigidly secured to the substrate 23 by silicon dioxide layer 39. A portion of one of the spring members 59 and anchor 132 is shown in FIGS. 6 and 7. First end portion 59a of the spring member 59 includes a secondary flexural member or damping beam 133 which is joined to spring member 59 at a position spaced from anchor 132. Beam 133 has a leg 133a which extends parallel to spring member 59 and is further secured to anchor 132. Damping beam 133 is also formed from top wafer 38 and is similar in construction to spring member 59. Leg 133a includes first and second, parallel sides surfaces 134. A channel 136 is provided in anchor 132 for receiving a portion of leg 133a. Channel 136 is formed in part by first and second spaced-apart wall surfaces 137 which extend parallel to side surfaces 134 and perpendicular to substrate 23.

A suitable damping material 112 of the type described above is disposed within channel 136 along each side of leg 133a. The damping material 112 adheres to side surfaces 134 of the leg 133a and to surfaces 137 of channel 136.

In operation and use, movement of movable structure 28 between its first and second positions is permitted by its deflection of springs 37 and, specifically, spring member 59. Damping beam 133 is caused to deflect or bend with spring member 59, resulting in strain in leg 133a and damping material 112 adhered thereto during motion of the structure 28. As discussed above, the strain induced in damping material 112 dissipates energy and thus damps the motion of movable structure 28 and collimating lens 27 at the resonant frequency of microactuator 131.

Microactuator 131 advantageously has a damping beam 133 which, like damping regions 113 of microactuator 22, is separate from the main flexural components, including spring members 59, of the microactuator 22. It is possible to control the amount of damping of microactuator 22 by adjusting the attachment point of damping beam 133 to spring member 59 and by adjusting the conformation of damping beam 133 and the length of leg 133a.

Figure 8:
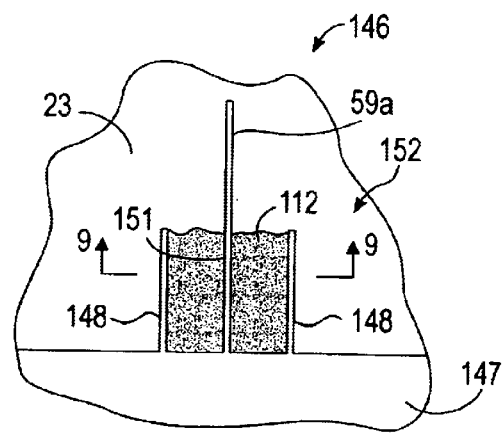
FIG. 8 is an enlarged view of a portion of a further damped micromechanical device of the present invention.
Figure 9:
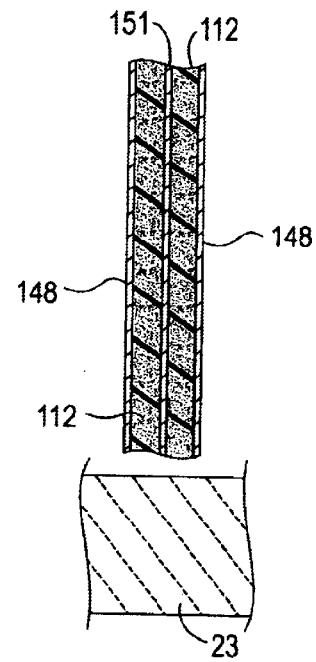
FIG. 9 is a cross-sectional view of the micromechanical device of FIG. 8 taken along the line 9—9 of FIG. 8.

In another embodiment shown in FIGS. 8 and 9, a portion of a microactuator 146 formed atop a substrate 23 is shown. Microactuator 146 is substantially similar to microactuator 22 and like reference numerals have been used to describe like components of microactuator 22 and 146. The microactuator 146 includes first and second spring 37 for supporting a movable structure 28 above substrate 23. Each spring 37 has a spring member 59 coupled to substrate 23 by means of an anchor 147. First and second spaced-apart constraining beams 148 extend over substrate 23 from anchor 147, for example a distance equal to air gap 41, along each side of each spring member 59. Beams 148 are formed from top wafer 38 and can have a length ranging from 20 to 200 microns and preferably approximately 100 microns. Spring member 59 is lengthened so as to have an extended portion 151 with a length approximately the length of first and second beams 148. Extended portion 151 is disposed between beams 148 and is preferably centered between the walls. The spacing or gap between extended portion 151 and each of beams 148 ranges from three to 30 microns and is preferably approximately 10 microns. Beams 148 have a height approximating the height of spring member 59 and in one preferred embodiment have a height of approximately 85 microns.

A suitable damping material 112, such as any of the damping materials discussed above, is adhered to each side surface of extended portion 151 and thus disposed between the extended portion 151 and beams 148 (see FIG. 9). Extended portion 151, beams 148 and damping material 112 adhered thereto form a damping region 152 which is separate and apart from the main flexural elements or members, including the main portion of spring members 59, of microactuator 22.

In operation and use, damping material 112 serves to damp the motion of movable structure 28 and thus collimating lens 47 during operation of microactuator 146. The damping material 112 is advantageously placed at the first end portion 59a of spring members 59 and along the side surfaces of extended portion 151 so as to maximize the strain in damping material 112, and thus the energy dissipated by the damping material, during operation of microactuator 131. Damping region 152 is advantageous for the reasons discussed above with respect to damping regions 113. In this regard, the lengthening of spring member 59 by the amount of extended portion 151 serves to minimize changes in the effective stiffness of spring member 59 from a similar microactuator where first end portion 59a of the spring member 59 is joined directly to an anchor.

Figure 10:
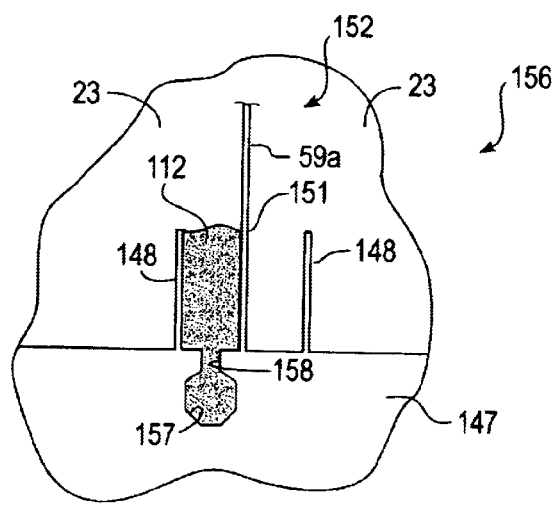
FIG. 10 is an enlarged view of a portion of yet another damped micromechanical device of the present invention.

In another embodiment shown in FIG. 10, a portion of a microactuator 156 that is substantially similar to microactuator 146 is shown. Like reference numerals have been used to describe like components of microactuator 146 and 156. Anchor 147 of microactuator 156 includes a reservoir 157 which communicates by means of a passageway 158 with the space provided between one of beams 148 and extended portion 151. It should be appreciated that a second passageway can be provided in anchor 147 for permitting reservoir 157 to communicate with the space between the other beam 148 and extended portion 151. Alternatively, a second reservoir and passageway can be provided in anchor 147 for communicating with such other space. Damping material can be provided on one side of extended portion 131, as shown, or on both sides of the extended portion 151, as in microactuator 146.

In operation and use, reservoir 157 acts in the same manner as reservoirs 116 and 118 of lens adjuster 21 to facilitate the introduction of damping material 112 onto the desired portion of the micromechanical device. After damping material 112 is introduced into reservoir 157, the damping material flows through passageway or injector 157 via capillary action to the space between beam 148 and extended portion 151. The incorporation of reservoir of 157 results in the use of larger volumes of damping material 112 and thus permits the use of conventionally-sized dispensing equipment and minimizes the need for precision dispensing techniques. It should be appreciated that a reservoir can be included within microactuator 131 or any other microdevice damped by any damping material in the manner disclosed herein.

Figure 11:
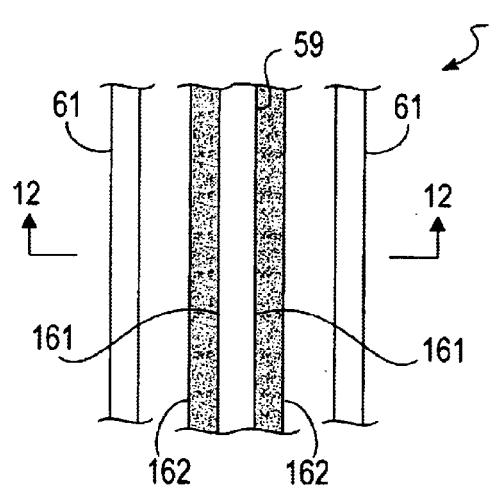
FIG. 11 is an enlarged view of a portion of yet a further damped micromechanical device of the present invention.

The methods heretofore discussed for applying damping material 112 to micromechanical devices have added the damping material after the micromechanical device has been etched or otherwise formed, for example after the structural components of lens adjuster 21 have been etched from top wafer 38 by deep reactive ion etching or other techniques. Damping material 112 can be adhered to one or more of the flexural or other movable members of a micromechanical device prior to the completion of the formation of such device or, more specifically, as part of the formation of such device. A portion of a spring 37 comprising a spring member 59 and first and second sacrificial bars 61 is shown in FIG. 11. Spring member 59 has first and second side surfaces 161 which are planar and extend parallel to each other. As shown in FIG. 11, a layer 162 of damping material 112 is adhered to both of side surfaces 161.

Figure 12:
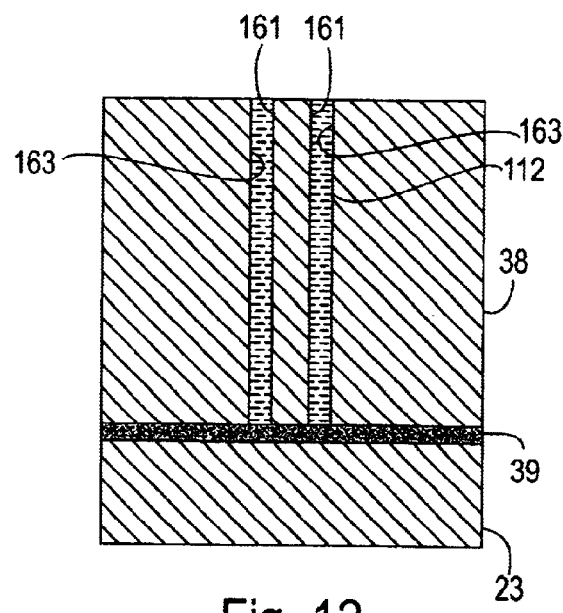
FIG. 12 is a cross-sectional view of the micromechanical device of FIG. 11, in the process of manufacture, taken along the line 12—12 of FIG. 11.
Figure 13:
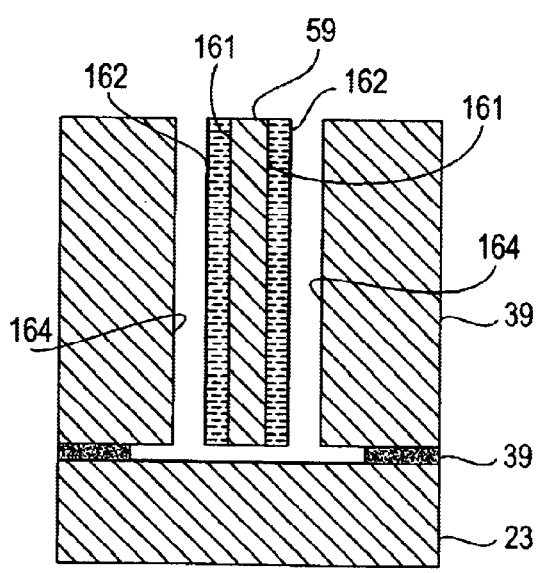
FIG. 13 is a cross-sectional view, subsequent in the process of manufacture to the view of FIG. 12, of the micromechanical device of FIG. 11.

A portion of the procedure for adhering damping material 112 to one or both of side surfaces 161 is shown in FIGS. 12 and 13. For simplicity, sacrificial bars 61 and other features of the micromechanical device are not shown in FIGS. 12 and 13. As discussed above, the various components of a micromechanical device such as microactuator 22 are formed from a layer of material such as top wafer 38 secured to the top of a substrate 23. In one preferred embodiment discussed above, an intermediate layer of an insulating material such as silicon dioxide layer 39 is disposed between top wafer 38 and substrate 23. In an initial step of the manufacturing procedure, one or more trenches or other recesses 163 are formed in top wafer 38 for defining one or more boundaries of a component of microactuator 22 (see FIG. 12). Specifically, first and second parallel trenches are provided in the top wafer 38 to form the boundaries of spring member 59. As such, trenches 163 are spaced apart a distance equal to the width of spring member 59. The trenches 163 preferably extend through top wafer 38 to silicon dioxide layer 39.

In a second step of the manufacturing procedure, damping material 112 is disposed within one or both of trenches 163 so as to adhere to side surfaces 161 of the spring member 59 being formed (see FIG. 12). In one preferred method, damping material 112 is applied over the entire surface of top wafer 38, for example by means of a spinning technique, so as to fill trenches 163 and other features formed in the top wafer. Where damping material 112 is an elastomer, the damping material is thereafter cured, for example by heating.

In the third step of the procedure, the material 112 remaining on the top surface of wafer 38 is selectively removed from the wafer. Several techniques can be used for performing this step. For example, oxygen plasma reactive ion etching can be used to remove a substantially constant thickness of material 112 from the top surface of wafer 38. The damping material 112 within trenches 163 is protected during this step. In an alternate technique, an etched mask such as aluminum is deposited and patterned on the top surface of wafer 38 and an appropriate etch, such as oxygen plasma, is used to remove damping material 112 from the majority of the surface of the wafer. The aluminum etched mask serves to protect damping material 112 within trenches 163 during such removal step. In a third technique, where a photosensitive polymer material is used for damping material 112 to fill trenches 163 or other desired features, a photolithography process step can be used to define the desired locations of such damping material.

In the next step of the manufacturing process, additional features, such as additional trenches 164, are etched or otherwise formed in wafer 38 to further define the mechanical structure of the micromechanical device. As shown in FIG. 13, an additional trench 164 is formed on both sides of spring member 59 along the outside surface of damping material 112 adhered to sides surfaces 161 of the spring member 59.

In a further step of such manufacturing method, the portion of silicon dioxide layer 39 beneath spring member 59 and damping material 112 is removed. In one technique in so removing such portion of layer 39, a release etch of a hydrofluoric solution is used to selectively remove silicon dioxide layer 39 so as to undercut spring member 59 and damping material 112 and therefore free them from substrate 23. The damping material 112 is chosen so that it is resistant to hydrofluoric solutions and will thus survive this process step. Larger features, such as anchors 63, remain attached to substrate 23 and thus form mechanical substrate attachments for these suspended features of the micromechanical device. It should be appreciated that other conventional techniques can be used to form larger cavities under suspended features such as spring member 59 and damping layers 163. Such selective removal of silicon dioxide layer 39 results in the formation of the suspended spring member 59 and damping layers 162 adhered thereto.

The foregoing process avoids the need for precision dispensing techniques for adhering damping material 112 to the flexural or other member to which it is to be applied. Instead, the damping material is applied to the micromechanical device during the fabrication process and the unwanted damping material removed as part of that process.

Other techniques can be utilized for adhering damping material 112 to selected features of lens adjuster 21 or other micromechanical devices. For example, the material Parylene can be polymerized conformally on the surface of a micromechanical device. The dimer of the eventual polymer is heated in a low pressure chamber and the monomer then forms the Parylene polymer on any exposed surface, for example side surfaces 161 and the top and bottom surfaces of spring member 59. Parylene can so be deposited in sub-micron layer thicknesses over complicated geometries. If the material is not desired in some locations, it can be selectively etched away using, for example, a shadow mask and oxygen reactive ion etching.

In addition to the materials discussed above, certain metals can be suitable for use as damping material 112 in accordance with the invention disclosed herein. One suitable metal, for example, is beryllium metal, which can be sputter deposited on the top and/or sidewalls of movable structures of a micromechanical device to increase damping of the device. Deposition on all or a portion of a flexural member of such device, as disclosed above, is preferred. In another application technique, beryllium metal can be electroplated on such structures. In a third application technique, plated beryllium metal structures can be used as a part of the Lithographie Gavanometrie and Abformung (LIGA) process for the formation of micromechanical devices. Another suitable metal for use as damping material 112 is lead.

The damping materials of the present invention can be adhered to an internal surface of a flexural or other movable member of a micromechanical device. For example, a recess or trench can be formed by any suitable technique inside such a flexural or movable member and the damping material disposed therein. With respect to spring member 59, for example, a trench can be formed along all or a portion of the length of the spring member and filled with damping material 112. The width of spring member 59 may need to be increased to accommodate such a recess or trench. The damping material can be introduced into such recess either after or during the manufacture of the device, for example by any of the techniques disclosed herein.

The damping techniques disclosed herein can be used in combination with the damping techniques disclosed in U.S. patent application Ser. No. 09/876,203 filed contemporaneously herewith, the entire content of which is incorporated herein by this reference.

As can be seen from the foregoing, a micromechanical device has been provided which is damped so as to control the resonant mode of the microactuator contained therein. A damping material can be adhered to a flexural or other movable member of the microactuator to damp the microactuator at such resonant mode and such material can be adhered to the flexural member after the manufacture of the microactuator or during the manufacture of the microactuator. When the material is adhered to the flexural member during the manufacture of the microactuator, the material can be introduced into an etched recess during such manufacture process. The material can be an elastomeric material, a metal or any other suitable material. The damped microactuator hereof is suited for moving structures throughout a broad range of motion to a variety of locations, and holding such structures at such locations, particularly in the presence of vibration or other disturbances at or near the resonance frequency.

What is claimed is:

1. A damped micromechanical device comprising a substrate extending in a plane, a movable structure overlying the substrate, a flexural member having a first end portion coupled to the substrate and a second end portion coupled to the movable structure and having a side surface extending substantially perpendicular to the plane of the substrate, the movable structure being movable at a resonant frequency between first and second positions relative to the substrate, and a damping material adhered to the side surface along the first end portion of the flexural member and rigidly coupled to the substrate for damping the movement of the movable structure at the resonant frequency.

2. The device of claim 1 further comprising a first comb drive member mounted on the substrate, the movable structure including a second comb drive member, the second comb drive member being movable at the resonant frequency between first and second positions relative to the first comb drive member.

3. The device of claim 2 wherein the first comb drive member has a plurality of first comb drive fingers and the second comb drive member has a plurality of second comb drive fingers, the second comb drive fingers being not substantially fully interdigitated with the first comb drive fingers when the second comb drive member is in the first position and the second comb drive fingers being substantially fully interdigitated with the first comb drive fingers when the second comb drive member is in the second position.

4. The device of claim 1 wherein the flexural member has a top surface extending substantially parallel to the plane of the substrate, the top surface being free of damping material.

5. The device of claim 1 wherein the damping material is an elastomeric material.

6. The device of claim 5 wherein the elastomeric material is selected from the group consisting of silicon rubber, urethanes and epoxies.

7. The device of claim 1 wherein the damping material is a beryllium metal.

8. The device of claim 1 wherein the movable structure has a mechanical quality factor Q ranging from 0.3 to 20.

9. The device of claim 8 wherein the movable structure has a mechanical quality factor Q ranging from 0.5 to 3.

10. The device of claim 1 wherein the substrate has a side surface facing the first end portion of the flexural member, the damping material adhered to the side surface of the substrate.

11. The device of claim 10 wherein the side surface of the flexural member is spaced-apart from the side surface of the substrate by a space, the substrate being provided with a reservoir for receiving the damping material, the reservoir being in fluid communication with the space for permitting damping material to flow from the reservoir into the space.

12. The device of claim 11 wherein the substrate is provided with a passageway extending from the reservoir to the space for permitting damping material to flow from the reservoir into the space.

13. A damped micromechanical device comprising a substrate extending in a plane, a movable structure overlying the substrate, a flexural member having a first end portion coupled to the substrate and a second end portion coupled to the movable structure and having a side surface extending substantially perpendicular to the plane of the substrate, the movable structure being movable at a resonant frequency between first and second positions relative to the substrate, and a damping material adhered to the side surface along at least a portion of the flexural member for damping the movement of the movable structure at the resonant frequency, the flexural member having a top surface extending substantially parallel to the plane of the substrate, the top surface being free of damping material.

14. The device of claim further comprising a first comb drive member mounted on the substrate, the movable structure including a second comb drive member, the second comb drive member being movable at the resonant frequency between first and second positions relative to the first comb drive member.

15. The device of claim 14 wherein the first comb drive member has a plurality of first comb drive fingers and the second comb drive member has a plurality of second comb drive fingers, the second comb drive fingers being not substantially fully interdigitated with the first comb drive fingers when the second comb drive member is in the first position and the second comb drive fingers being substantially fully interdigitated with the first comb drive fingers when the second comb drive member is in the second position.

16. The device of claim 13 wherein the damping material is adhered to the first end portion of the flexural member.

17. The device of claim 13 wherein the damping material is an elastomeric material.

18. The device of claim 17 wherein the elastomeric material is selected from the group consisting of silicon rubber, urethanes and epoxies.

19. The device of claim 13 wherein the damping material is a beryllium metal.

20. The device of claim 13 wherein the movable structure has a mechanical quality factor Q ranging from 0.3 to 20.

21. The device of claim 20 wherein the movable structure has a mechanical quality factor Q ranging from 0.5 to 3.

22. The device of claim 13 wherein the substrate has a side surface facing the portion of the flexural member, the damping material adhered to the side surface of the substrate.

23. The device of claim 22 wherein the side surface of the flexural member is spaced-apart from the side surface of the substrate by a space, the substrate being provided with a reservoir for receiving the damping material, the reservoir being in fluid communication with the space for permitting damping material to flow from the reservoir into the space.

24. The device of claim 23 wherein the substrate is provided with a passageway extending from the reservoir to the space for permitting damping material to flow from the reservoir into the space.

25. A damped micromechanical device comprising a substrate extending in a plane, a movable structure overlying the substrate, a flexural member having a first end portion coupled to the substrate and a second end portion coupled to the movable structure and having a side surface extending substantially perpendicular to the plane of the substrate, the movable structure being movable at a resonant frequency between first and second positions relative to the substrate, and a damping material adhered to the side surface along at least a portion of the flexural member for damping the movement of the movable structure at the resonant frequency, the substrate having a side surface facing the portion of the flexural member, the damping material being adhered to the side surface of the substrate.

26. The device of claim 25 further comprising a first comb drive member mounted on the substrate, the movable structure including a second comb drive member, the second comb drive member being movable at the resonant frequency between first and second positions relative to the first comb drive member.

27. The device of claim 26 wherein the first comb drive member has a plurality of first comb drive fingers and the second comb drive member has a plurality of second comb drive fingers, the second comb drive fingers being not substantially fully interdigitated with the first comb drive fingers when the second comb drive member is in the first position and the second comb drive fingers being substantially fully interdigitated with the first comb drive fingers when the second comb drive member is in the second position.

28. The device of claim 25 wherein the damping material is adhered to the first end portion of the flexural member.

29. The device of claim 25 wherein the damping material is an elastomeric material.

30. The device of claim 29 wherein the elastomeric material is selected from the group consisting of silicon rubber, urethanes and epoxies.

31. The device of claim 25 wherein the damping material is a beryllium metal.

32. The device of claim 25 wherein the movable structure has a mechanical quality factor Q ranging from 0.3 to 20.

33. The device of claim 32 wherein the movable structure has a mechanical quality factor Q ranging from 0.5 to 3.

34. The device of claim 25 wherein the side surface of the flexural member is spaced-apart from the side surface of the substrate by a space, the substrate being provided with a reservoir for receiving the damping material, the reservoir being in fluid communication with the space for permitting damping material to flow from the reservoir into the space.

35. The device of claim 34 wherein the substrate is provided with a passageway extending from the reservoir to the space for permitting damping material to flow from the reservoir into the space.

* * * * *